United States Patent [19]

Dorri et al.

[11] Patent Number: 5,006,804
[45] Date of Patent: Apr. 9, 1991

[54] METHOD OF OPTIMIZING SHIM COIL CURRENT SELECTION IN MAGNETIC RESONANCE MAGNETS

[75] Inventors: Bizhan Dorri, Clifton Park, N.Y.; Jay F. Benesch, Gaithersburg, Md.

[73] Assignee: General Electric Company, Schenectady, N.Y.

[21] Appl. No.: 445,508

[22] Filed: Dec. 4, 1989

[51] Int. Cl.$^5$ .............................................. G01R 33/20
[52] U.S. Cl. ................................................... 324/320
[58] Field of Search ............... 324/320, 318, 322, 319; 335/299, 296

[56] References Cited

U.S. PATENT DOCUMENTS

| | | | |
|---|---|---|---|
| 4,625,826 | 3/1987 | Yamamoto et al. | 324/320 |
| 4,680,551 | 7/1987 | O'Donnell et al. | 324/320 |
| 4,737,754 | 4/1988 | Goldie | 335/299 |
| 4,812,765 | 3/1989 | Aubert | 324/320 |

Primary Examiner—Michael J. Tokar
Assistant Examiner—Louis M. Arana
Attorney, Agent, or Firm—Patrick R. Scanlon; James C. Davis, Jr.; Paul R. Webb, II

[57] ABSTRACT

A method of shimming a magnet having correction coils is provided. The field strength in the bore of the magnet is measured at a predetermined number of points. The field inhomogeneity is determined from the measured field strengths. The field created by a fixed current in each shim coil operating alone, at each of the predetermined points is determined. The shim correction coil currents are determined using a linear programming solver to minimize the field inhomogeneity and the correction coil currents. The correction coil currents are determined based on the measured field in the bore of the magnet and the field created by each of the shim coils when carrying a fixed current, with the correction coil currents each constrained to a maximum value which is adjusted for the current in the correction coils when the field strength was measured. The correction coils are adjusted to the determined values and the fields strength of the magnet is gain measured at the predetermined points. The inhomogeneity is again determined and compared to a desired value of inhomogeneity. If the inhomogeneity is greater than desired, then shim correction coil currents are again determined, the determined shim coil currents set, and the field measured until the desired inhomogeneity is achieved.

4 Claims, 3 Drawing Sheets

METHOD OF OPTIMIZING SHIM COIL CURRENT SELECTION IN MAGNETIC RESONANCE MAGNETS

CROSS REFERENCE TO RELATED APPLICATIONS

This application is related to copending application Ser. No. 07/445,510 entitled "Method of Optimizing Passive Shim Placement in Magnetic Resonance Magnets" assigned to the same assignee as the present invention.

BACKGROUND OF THE INVENTION

The present invention relates to a method of determining electrical currents to be used in active shim coils in magnetic resonance magnets to maximize the magnetic field homogeneity in the bore of the magnet.

In magnetic resonance (MR) magnets a uniform magnetic field is used to polarize the hydrogen nuclei located in the subject being scanned. Magnetic field inhomogeneities will distort the position information in the scan volume and degrade the image quality. In chemical shift spectroscopy the chemically shifted frequency peaks are often separated by a fraction of one part per million, requiring high field homogeneity. To create a highly uniform magnetic field with an electromagnet, it is necessary to build the magnet to a carefully specified shape, and to strive to minimize the deviations from the specified shape due to manufacturing variations. The resulting magnet, however, typically requires field correction to achieve the desired level of homogeneity, due to deviations of the magnet from the design or due to the presence of ferromagnetic material in the vicinity of the magnet.

To improve field uniformity, correction coils are typically used. These coils are capable of creating different field shapes which can be superimposed on an inhomogeneous main magnetic field to perturb the main magnetic field in a manner which increases the overall field uniformity. Many sets of such coils are typically required. The state of the art magnetic resonance imaging magnet has between 10 and 20 independent sets of correction coils, each with its own power supply to provide the correct current flow. The correction coils may be resistive, superconducting or a combination of both. Correction coils are generally designed to produce certain terms of a spherical harmonic field expansion. By energizing the coils at a proper combination of currents, a homogeneous field can be achieved within the imaging volume.

Presently, the currents in coils positioned in the bore of the magnet and placed to eliminate selected harmonics are determined by decomposing the magnetic field produced by the magnet into several terms of a spherical harmonic expansion and predicting coil currents which eliminate these harmonics thereby increasing the homogeneity of the field.

There are several problems in using selective harmonic elimination. One of the problems occurs when the magnetic field is corrected for the wrong harmonics. This can occur because of an undersampling of the magnetic field and/or low order fitting. Undersampling does not allow proper determination of the harmonic components that make up the field, particularly the high order harmonics. Low order fitting may not eliminate the high order harmonics which can significantly contribute to the inhomogeneity. The low order correction coils while generating significant amounts of the harmonic they were designed to produce, also generate other higher order harmonics. The determination of the currents of the correction coils when using harmonic elimination requires many iterations resulting in long computation times, sometimes generating solutions which cannot be used because of the current limitations of the correction coil power supplies.

A linear least squares approach described and claimed in U.S. Pat. No. 4,771,244, minimizes the average field tolerances. Two disadvantages with this method are that it is not a peak to peak minimization and therefore only indirectly reduces the peak to peak field inhomogeneity. In MR magnets inhomogeneity is specified in parts per million peak to peak. Secondly, there are no constraints in the linear least squares method on the predicted shim currents which from time to time result in predicted currents which surpass the limits of the shim coil power supplies. When the predicted shim currents exceed the power supply capability, iron shims need to be used in combination with the correction coils.

It is an object with the present invention to provide a method of shimming magnets using correction coils with correction coil currents that do not exceed any of the correction coil power supplies capabilities and which minimize global peak to peak magnetic field inhomogeneity.

SUMMARY OF THE INVENTION

In one aspect of the present invention a method of shimming a magnet having correction coils is provided. The field strength in the bore of the magnet is measured at a predetermined number of points. The field inhomogeneity is determined from the measured field strengths. The field created by a fixed current in each shim coil operating alone, at each of the predetermined points is determined. The shim correction coil currents are determined using a linear programming solver to minimize the field inhomogeneity and the correction coil currents. The correction coil currents are determined based on the measured field in the bore of the magnet and the field created by each of the shim coils when carrying a fixed current, with the correction coil currents each constrained to a maximum value which is adjusted for the current in the correction coils when the field strength was measured. The correction coils are adjusted to the determined values and the field strength of the magnet is again measured at the predetermined points. The inhomogeneity is again determined and compared to a desired value of inhomogeneity. If the inhomogeneity is greater than desired, then shim correction coil currents are again determined, the determined shim coil currents set, and the field measured until the desired inhomogeneity is achieved.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with accompanying figures in which:

DETAILED DESCRIPTION OF THE INVENTION

Figure 1:
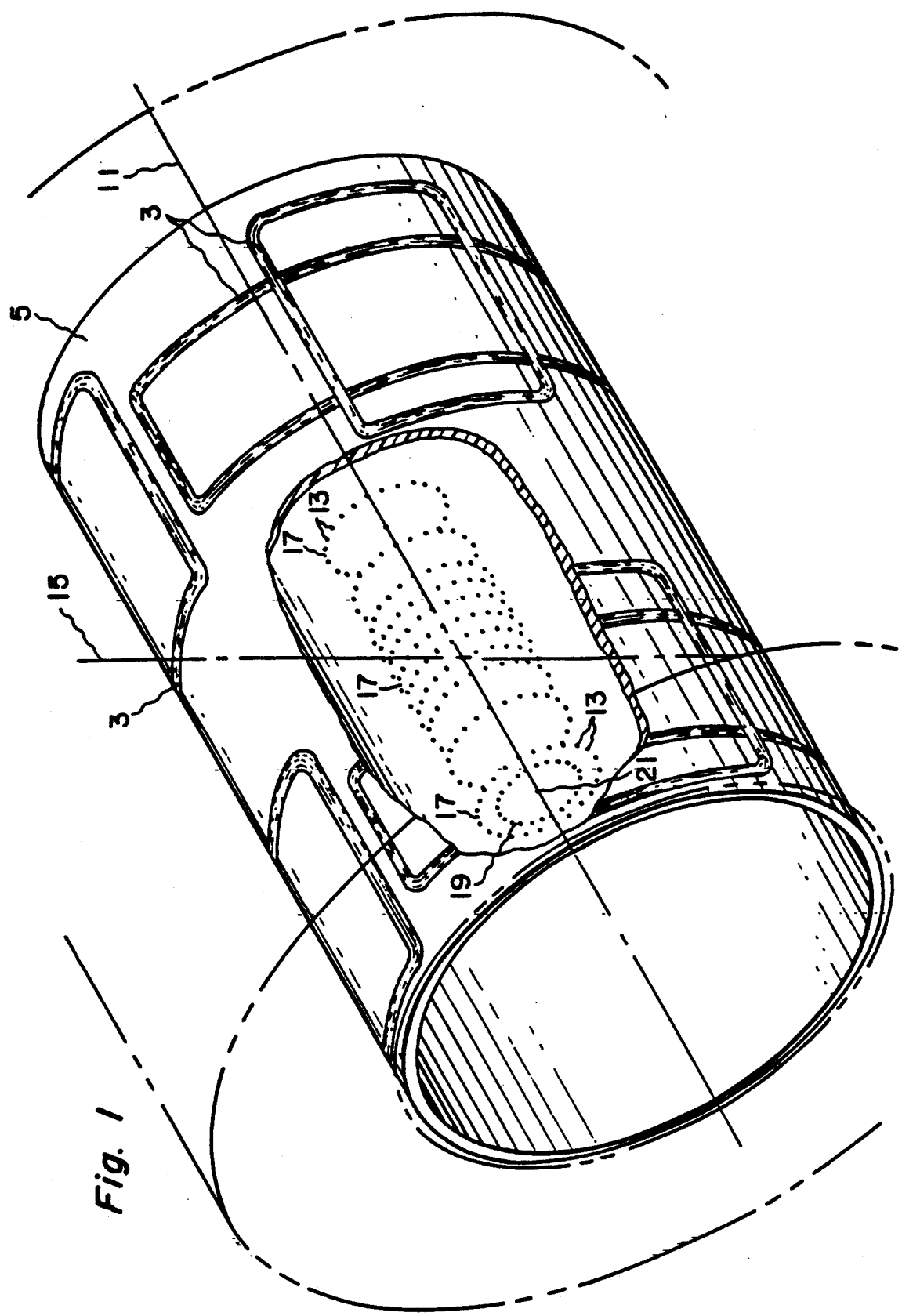
FIG. 1 is a partially cutaway isometric view of correction coils mounted on a cylindrical sleeve with an imaginary cylindrical grid situated inside the sleeve where field measurements are taken.

To predict shim coil currents for achieving a global minimum peak to peak inhomogeneity, where peak to peak minimum inhomogeneity is the difference between the highest measured field value anywhere in the volume of interest and the lowest measured field value anywhere in the volume of interest, and to have the predicted coil currents within the correction coil power supply limits, the problem is formulated as a linear programming problem. Linear programming is a mathematical technique for maximizing or minimizing a linear equation called an objective function whose variables are restricted to values satisfying a system of linear constraints. Solving linear programming problems can be accomplished by several well known techniques. However, formulating the problem is an art in itself for which there are no simple methods or rules available. In the present invention, the objective function is to minimize total shim current plus field tolerance (inhomogeneity). The constraints include having the field values at every measured point to be within half of the tolerance of the mean value of the overall field. The mean value of the overall field is one half the sum of the maximum and minimum field values anywhere in the measured field. The objective function is shown in equation 1. N is the total number of shim coils. M is the total number of points at which field is measured. The current in the $i^{th}$ shim coil is the $I_i$ and A is a weighting factor. T is the peak to peak field tolerance beyond the allowable tolerance E. $I_i$ and T are unknown variables.

$$\text{MINIMIZE} \sum_{i=1}^{2N} AI_i + T \quad (1)$$

Subject to:

$$\sum_{i=1}^{N} \Delta B_{ij}I_i - \sum_{i=1}^{N} \Delta B_{ij}I_{N+i} + \quad (2)$$

$$BM_j - BMEAN \leq T/2 + E/2 \text{ for } j = 1 \text{ to } M$$

$$\sum_{i=1}^{N} \Delta B_{ij}I_i - \sum_{i=1}^{N} \Delta B_{ij}I_{N+i} + \quad (3)$$

$$BM_j - BMEAN \geq -T/2 - E/2 \text{ for } j = 1 \text{ to } M$$

$$I_i \leq I_m \text{ for } i = 1 \text{ to } 2N \quad (4)$$

All Y's $\geq 0$.

The objective function (equation 1) needs to be minimized subject to the constraints in equations 2, 3 and 4. Equations 2 and 3 provide the constraints for having field values of every measured point to be within half of the tolerance of the mean value of the field strength of all of the points. BMEAN is an unknown variable representing the mean value between the maximum and minimum field strength anywhere in the measured field. Equation 4 states that $I_m$ the maximum current capacity of the shim coils is greater or equal than any of the currents selected.

The equations are set up to handle N shim coils. The field is measured at M points inside the bore of the magnet. Because of the non-negativity constraint for variables in linear programming, the first N values of $I_i$ represent those coils with positive currents and the second N values $I_{i+N}$ represent the coils with negative currents. If, for example, the first shim current was determined to be positive $I_1$ would be nonzero and $I_{1+N}$ would be 0. If the second shim coil was found to have a negative current, $I_2$ would be 0 and $I_{2+n}$ would be nonzero. The term $\Delta B_{ij}$ represents the change in magnitude of the field at point j caused by passing 1 ampere of current in the $i^{th}$ shim coil. This value can be determined by actually passing the current through the $i^{th}$ shim coil and measuring the field at all $j=1$ to M points or calculating the field strength numerically. The term $BM_j$ represents the actually measured field value at point j, where the index j varies over all M points in the bore of the magnet.

In one embodiment of the present invention, there are 18 shim coils and 314 measured field points. This results in a linear programming problem with 38 variables and 664 constraints. Eighteen variables $I_1$-$I_{18}$ for the first i currents representing the positive currents. Eighteen variables $I_{19}$-$I_{36}$ representing the currents which are negative. It will be remembered that none of the currents are both positive and negative and there will be no more than 18 non-zero currents for $I_1$-$I_{36}$. The other two variables are BMEAN and T. The 664 constraints are provided by 314 equations resulting from checking equation 2 for each of the 314 values of j. Similarly another 314 equations result from checking the 314 values of j in equation 3. The 36 values of I in equation 4 provide another 36 constraints. While $I_i$, T, and BMEAN are unknown variables only $I_i$ is an independent variable with T and BMEAN dependent variables, since once all the $I_i$ have been determined T and BMEAN can be determined. The linear program approach however, determines the $I_i$, T, and BMEAN simultaneously.

The linear programming problem with 38 variables and 664 constraints can be solved using any linear programming algorithm. However, due to the high density of the coefficient matrix (most of the variables within the constraints have non-zero coefficients) used to solve the linear programming problem, computation time would be high for a standard linear programming algorithm.

Examining the formulation suggests that both phase 1 and phase 2 of a linear program needs to be solved. This is due to the fact that some of the constraints when expressed in less than or equal to form have a negative right-hand side. Phase 1 is systematic method of finding a basic feasible solution or determining that none exists. A basic feasible solution is one that meets all the constraints but does not necessarily minimize the objective function. Once an initial basic feasible solution has been determined, an optimal solution is determined in phase 2.

If the linear programming problem is expressed in its dual form, the resulting problem will have 664 variables and 38 constraints and only the phase 2 problem needs to be solved, since zero is a feasible solution. A dual of a linear programming problem which has n variables and m inequalities and a linear objective function is to be minimized has a dual with m variables, n inequalities and a linear objective function which is to be maximized. The sign of the inequalities is opposite that of the original or primal system. Also, the coefficients on the right-hand side of the equation are those of the objective function of the other system and the coefficients are the same in both systems except that the columns in one correspond to the rows in the other, and vice versa. Of course any of the two systems can be taken as the primal, and the other is then the dual.

Because of the specific connection between the primal and dual systems there is a connection between the solutions. The linear programming algorithms simultaneously solves two linear programming problems, the primal and the dual. In the present situation, the linear programming problem is reformed into its dual and the dual solution of the dual problem represents the original primal solution.

The dual form is shown in equations 5-9 and has 664 variables and 38 constraints and only the phase 2 problem needs to be solved.

$$\text{MAXIMIZE} \sum_{j=1}^{M} \left[ \left( BM_j - \frac{E}{2} \right) Y_j - \left( BM_j + \frac{E}{2} \right) Y_{M+j} \right] - \sum_{i=1}^{2N} I_m Y_{2M+i} \quad (5)$$

$$\text{SUBJECT TO:} \ -\sum_{j=1}^{M} [\Delta B_{ij}(Y_j - Y_{M+j})] - Y_{2M+i} \le A \text{ for } i = 1 \text{ to } N \quad (6)$$

$$\sum_{j=1}^{M} [\Delta B_{ij}(Y_j - Y_{M+j})] - Y_{2M+N+i} \le A \text{ for } i = 1 \text{ to } N \quad (7)$$

$$\sum_{j=1}^{M} (Y_j - Y_{M+j}) \le 0 \quad (8)$$

$$\sum_{j=1}^{2M} 0.5 Y_j \le 1 \quad (9)$$

All Y's $\ge$ 0.

Here the Y's represent dual variables which do not have any physical meaning in the present problem, however, the dual solution of the dual problem is the solution of the original primal problem. There are many methods for solving linear programming problems such as the simplex, revised simplex, dual simplex, and Karmarkar's. The revised simplex method is an efficient way for solving this problem since many of the computations during pivoting operations can be reduced for the vertically symmetric coefficient matrix. In addition, computer storage can be reduced by having to store only half of the coefficient matrix.

In order to use linear programming to determine the shim currents, the field present in the bore of the magnet needs to be measured. FIG. 1 shows a correction coil mounted on a cylindrical sleeve positioned in the bore of a magnet. Since the field inside a volume positioned about the center of the bore typically becomes more inhomogeneous as you move away from the center of the bore, only the periphery of the volume of interest needs to be measured. Once the inhomogeneity of the periphery of the volume of interest is reduced, the inhomogeneity inside the volume will become smaller than the inhomogeneity at the periphery. FIG. 1 shows correction coils 3 mounted on a cylindrical sleeve 5 of nonmagnetic noncurrent conducting material which is positioned in the bore of a magnet. One series of measurement points is shown in FIG. 1 and involves an imaginary cylindrical volume having a longitudinal axis 11 which is aligned with the longitudinal axis of the bore. The measurement points are shown as dots 13 in FIG. 1. The center of the measured volume is coincident with the center of the bore which occurs at the intersection of the longitudinal axis with the centerline 15 of the cylinder. The measurement cylinder is 40 cm. long and has a diameter of 30 cm. Eleven imaginary circles 17 with a 30 cm. diameter are spaced along the cylindrical volume each having 24 points equally circumferentially spaced about the perimeter of each of the circles. Additional imaginary circles 19 with a diameter of 20 cm. (one of which is not shown) are each located concentric with a respective one of the two end circles 17. The 20 cm. diameter circles also have 24 points each equally circumferentially spaced. Two additional points 21 (one of which is not shown) are located at the center of each of the 20 cm. diameter circles to provide the total of 314 points.

Figure 2:
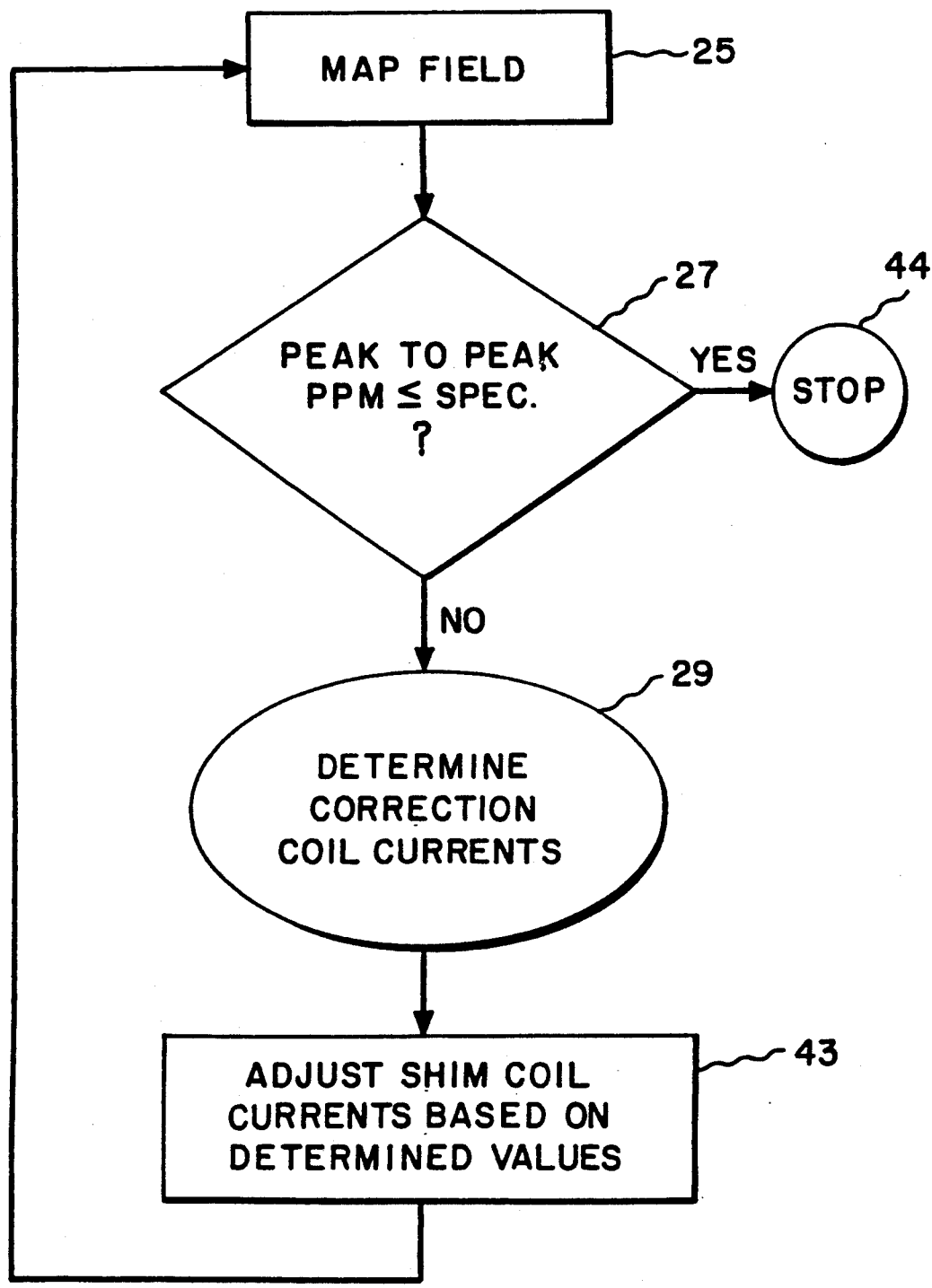
FIG. 2 is a flow chart showing the steps in shimming a magnet with correction coils in accordance with the present invention.
Figure 3:
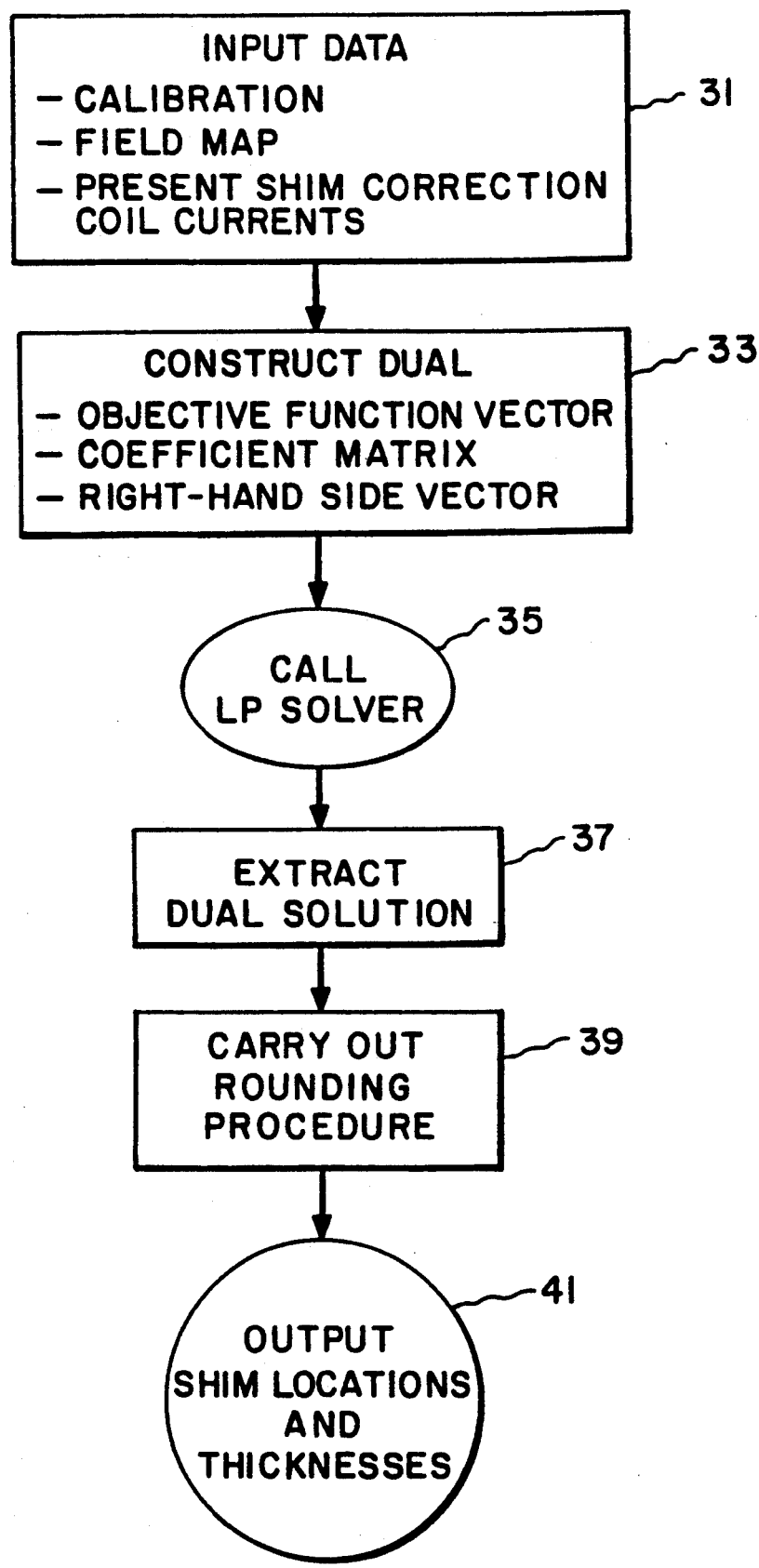
FIG. 3 shows the step of determining the correction coil currents in FIG. 2 in more detail in flow chart form in accordance with the present invention.

Referring now to FIG. 2, a flow chart showing the steps of the method of the present invention is shown. In block 25 the field strength is measured at each of the measurement points to map the field in the bore of the energized magnet. Next, in decision block 27 the peak to peak field measured between the highest and lowest values of all the 314 points is compared to the desired peak to peak field. If the peak to peak field is greater than desired, the code for determining the shim currents is run in block 29. A flow chart showing the steps carried out in block 29 in determining the shim currents is shown in FIG. 3. First in block 31 of FIG. 3, data is needed regarding the effect of each of the shim coils individually on the magnetic field at each of measurement points. This data can be determined by energizing each correction coil separately and measuring its strength at the 314 points of each of the shim coils. Alternatively, a numerical analysis can be performed to determine the field strength at the 314 points. The weighting factor A in equation 1 is selected to be a small value if the peak to peak measured field is large and a larger value if the peak to peak field is close to the desired amount. The weighting factor effects where the emphasis in the objective function to be minimized is to be placed. If the weighting factor is small, then minimizing of the field is more important than limiting the size of the currents in the coils. If the weighting factor is larger, then achieving improved field homogeneity with small currents becomes more important. As an example, the weighting factor can be set equal to 30/peak to peak ppm. The weighting factor will be small for a magnet which has a large field inhomogeneity and larger for a magnet with a smaller inhomogeneity. The currents presently being used in the correction coils also needs to be accounted for. Initially, the currents are all zero.

The dual linear programming problem is constructed in block 33 based on the field map and the effect of a current in each of the shims. Once the objective function vector of the dual together with the coefficient matrix and right-hand side of the vector of the dual have been established based on the dual shown in equations 5-9, the linear program solver is called in block 35. The dual solution of the dual problem is extracted in block 37 to provide the currents for each of the correction coils. The currents are rounded to the nearest milliampere in block 39 and available as the output of the ASHIM code. Referring again to FIG. 2, the shim coils in the magnet are adjusted to achieve the currents predicted in block 43. The ASHIM code can be run on a portable PC with a memory requirement of less than 0.5 MB. The code takes approximately two minutes to run.

The field is again mapped in block 25 with the shim currents flowing at their determined values and the peak to peak ppm inhomogeneity again determined. If the field still is more inhomogeneous than desired, as determined in decision block 27, the code in block 29 is run again. The weighting factor is changed since the ppm error has been reduced making minimizing the current changes more important than it was previously. The tolerance still needs to be minimized, however. The maximum currents that each shim coil can carry is reduced by the current currently being used, so that the currents found when combined with the currents already being used will not exceed the shim coil capacity.

When the peak to peak ppm is close to the desired level, any changes to the current should be small to minimize the difference between the resulting field and the predicted field. The linear programming equation assumes no interaction between different shim coils and further that the field produced by the shim coils varies linearly with current. These approximations yield accurate results particularly when the changes in currents are small.

When the shim coil currents are adjusted to reflect the changes provided by the code, the field is again mapped. If the peak to peak inhomogeneity is within the specification, acceptable shim currents have been found and the method has been completed. If the inhomogeneity is still too large, the code can be run again and new shim currents determined.

The method provided allows shimming of coils in the field with a portable computer with the shim code providing a solution in several minutes. The solution provided never exceeds the power supply limitations.

The linear programming algorithm was used on data from 52 magnets that had been shimmed using a least squares method. Use of the linear programming algorithm resulted in a calculated 37% improved peak to peak homogeneity. On the data from 6 magnets which required currents of over 20 amperes (beyond the capability of the power supply) when a least squares program was executed, a 30% improvement in predicted peak to peak field homogeneity was achieved while staying within the 20 ampere constraint using the linear programming algorithm. The method of the present invention has been used successfully to shim magnets and has always converged within the limitation of the power supplies.

The foregoing has described a method of shimming magnets using correction coils with correction coil currents that do not exceed any of the correction coil power supplies capabilities and which minimizes global peak to peak magnetic field inhomogeneity.

While the invention has been described with respect to a preferred embodiment thereof, it will be understood by those skilled in the art that various changes in form and detail may be made without departing from the spirit and scope of the invention.

What is claimed is:

1. A method of shimming a magnet having correction coils, comprising the steps of:
   (a) measuring the field strength in the bore of the magnet at a predetermined number of points;
   (b) determining the field inhomogeneity from the measured field strengths;
   (c) determining the field created by a fixed current in each shim coil operating alone, at each of the predetermined points;
   (d) determining the shim correction coil currents using a linear programming solver to minimize the field inhomogeneity and the correction coil currents used in the shims, the correction coil currents being determined based on the measured field in the bore of the magnet and the field created by each of the shim coils when carrying a fixed current, with the correction coil currents each constrained to a maximum value which is adjusted for the current in the correction coils when the field strength in the bore of the magnet was measured;
   (e) adjusting the currents in the correction coils to the determined values;
   (f) measuring the field strength of the magnet and correction coils at the predetermined number of points in the magnet;
   (g) determining the field inhomogeneity from the measured field strengths;
   (h) comparing the field inhomogeneity to a desired value; and
   (i) repeating steps d, e, f, g, and h until the field inhomogeneity is less than or equal the desired inhomogeneity.

2. The method of claim 1 wherein the step of determining the shim correction coil currents further comprises changing the importance of minimizing the currents used in the shim coils relative to the importance of minimizing the inhomogeneity with smaller measured field inhomogeneities increasing the weight given minimizing the shim coil currents.

3. The method of claim 1 wherein the field inhomogeneities is measured in terms of the global peak to peak field homogeneity and the global peak to peak field inhomogeneity is minimized when the shim correction coil currents are determined.

4. A method of shimming a magnet having correction coils, comprising the steps of:
   (a) measuring the field strength in the bore of the magnet at a predetermined number of points;
   (b) determining the global peak to peak field inhomogeneity from the measured field strengths;
   (c) determining the field created by a fixed current in each shim coil operating alone at each of the predetermined points;
   (d) determining the shim correction coil currents using a linear programming solver to minimize the field inhomogeneity and the correction coil currents used in the shims, the correction coil currents being determined based on the field measured in the bore of the magnet and the field created of the shim coils when carrying a fixed current, with the correction coil currents each constrained to a maximum value which is adjusted for the current in the correction coils when the field strength in the bore of the magnet, the importance of minimizing the currents used in the shim coils each relative to the importance of minimizing the peak to peak field inhomogeneity changing with the measured field inhomogeneity, smaller measured field inhomogeneity increasing the weight given to minimizing the shim coil currents was measured;
   (e) adjusting the currents in the correction coils to the determined values;

(f) measuring the field strength of the magnet and correction coils at the predetermined number of points in the magnet;
(g) determining the global peak to peak field inhomogeneity from the measured field strengths;
(h) comparing the peak to peak field inhomogeneity to a desired value; and
(i) repeating steps d, e, f, g, and h until the peak to peak field inhomogeneity is less than or equal the desired inhomogeneity.

* * * * *